(12) United States Patent
Katz et al.

(10) Patent No.: US 9,350,307 B2
(45) Date of Patent: May 24, 2016

(54) METHOD FOR OPERATING AN AMPLIFIER MODULE OF A SATELLITE

(71) Applicant: Tesat-Spacecom GmbH & Co. KG, Backnang (DE)

(72) Inventors: Hanspeter Katz, Stuttgart (DE); Gerhard Reinwald, Aspach (DE)

(73) Assignee: Tesat-Spacecom GmbH & Co. KG, Backnang (DE)

( * ) Notice: Subject to any disclaimer, the term of this patent is extended or adjusted under 35 U.S.C. 154(b) by 252 days.

(21) Appl. No.: 14/218,087

(22) Filed: Mar. 18, 2014

(65) Prior Publication Data
US 2014/0285259 A1    Sep. 25, 2014

(30) Foreign Application Priority Data
Mar. 19, 2013   (DE) .................. 10 2013 004 673

(51) Int. Cl.
| | | |
|---|---|---|
| *H03F 3/58* | (2006.01) | |
| *H04B 1/16* | (2006.01) | |
| *H04W 72/00* | (2009.01) | |
| *H04B 3/36* | (2006.01) | |
| *H03F 1/52* | (2006.01) | |
| *H03F 3/54* | (2006.01) | |
| *H03F 3/60* | (2006.01) | |
| *H03F 3/189* | (2006.01) | |
| *H04B 7/185* | (2006.01) | |
| *H04B 17/17* | (2015.01) | |
| *H04B 17/10* | (2015.01) | |
| *H04B 17/16* | (2015.01) | |

(52) U.S. Cl.
CPC .. *H03F 3/58* (2013.01); *H03F 1/52* (2013.01); *H03F 3/189* (2013.01); *H03F 3/54* (2013.01); *H03F 3/60* (2013.01); *H04B 7/18515* (2013.01); *H04B 17/104* (2015.01); *H04B 17/16* (2015.01); *H04B 17/17* (2015.01)

(58) Field of Classification Search
USPC ................................. 330/43; 455/450, 341, 8
IPC ....... H03F 3/58; H04B 1/16,3/36; H04W 72/00
See application file for complete search history.

(56) References Cited

U.S. PATENT DOCUMENTS

| | | | | |
|---|---|---|---|---|
| 6,072,994 | A * | 6/2000 | Phillips | ................. G01S 13/767 375/219 |
| 8,208,874 | B2 * | 6/2012 | Seymour | ............... H03F 1/0211 330/10 |
| 2002/0177404 | A1 | 11/2002 | Hudson et al. | |
| 2003/0231057 | A1 | 12/2003 | Hiramoto et al. | |

(Continued)

FOREIGN PATENT DOCUMENTS

| | | |
|---|---|---|
| DE | 10 2004 018 137 A1 | 10/2005 |
| EP | 0 623 994 A2 | 11/1994 |

(Continued)

OTHER PUBLICATIONS

European Search Report dated Jul. 4, 2014 (three pages).

*Primary Examiner* — Patricia T Nguyen
(74) *Attorney, Agent, or Firm* — Crowell & Moring LLP

(57) ABSTRACT

A method for operating an amplifier module of a communication satellite involves establishing an undesired state of the amplifier module, storing state data, which indicate the undesired state, in a nonvolatile memory of the amplifier module, after the undesired state has been established, and deactivating the amplifier module after the storage of the state data.

15 Claims, 2 Drawing Sheets

(56) References Cited

U.S. PATENT DOCUMENTS

| | | | |
|---|---|---|---|
| 2005/0107976 A1* | 5/2005 | Klijn | G01R 31/3272 702/118 |
| 2006/0103460 A1 | 5/2006 | Eng | |
| 2007/0042732 A1* | 2/2007 | Kang | H03J 3/08 455/179.1 |
| 2010/0291866 A1 | 11/2010 | Coromina | |
| 2015/0245186 A1* | 8/2015 | Park | H04W 4/16 455/417 |

FOREIGN PATENT DOCUMENTS

| | | |
|---|---|---|
| EP | 1 478 088 A2 | 11/2004 |
| WO | WO 84/04215 A1 | 10/1984 |

\* cited by examiner

METHOD FOR OPERATING AN AMPLIFIER MODULE OF A SATELLITE

FIELD OF THE INVENTION

The invention relates to a method for operating an amplifier module of a communications satellite, and an amplifier module.

BACKGROUND OF THE INVENTION

Traveling wave tube amplifiers (TWTA), which are typically embodied as traveling wave tube modules, are predominantly used as power amplifiers in satellites. These modules comprise a traveling wave tube, which predominantly determines the high-frequency properties, and a power supply, which generates the supply voltages for the traveling wave tubes, a telemetry and/or telecommand interface to the satellite, and a controller. The traveling wave tube module can be supplemented by a preamplifier (also called a channel amplifier), which may also contain a linearizer. The preamplifier can be integrated with the other components in a housing. This combination is typically referred to as a high-frequency power module.

Traveling wave tube modules and amplifier modules in general can also comprise a protective function component, in which one or more protective functions are embodied, to protect the amplifier from damage, for example, from an excessively low supply voltage, an overload at the outputs of the power supply, an excessively high current on the delay structure, etc. If one of these protective functions is activated, the amplifier module automatically shuts down.

A ground station is typically informed via telemetry data, which are transmitted from the satellite to the ground station, about the shutdown or also about successful restarting of the amplifier module. However, it cannot be determined from the telemetry data why the device has displayed the malfunction or which protective function was active.

In general, telemetry data are provided to the satellite as an analog value in the case of analog data or as digital information in the case of status data or already digitized as a digital word from the amplifier module. A system of the satellite reads out the data at regular intervals, wherein the time between two read procedures is typically several seconds (for example, 60 seconds). If an automatic re-start of the amplifier module was successful, this is indicated by a corresponding status telemetry. However, it typically cannot be established from these data which parameter has triggered the protective function. The telemetry data are also not provided promptly as a result of the long read intervals.

For deep space missions, devices have been developed which, in the case of a malfunction, additionally indicate which parameter has triggered the protective function. However, if the device is completely shut down by the protective function, this information is lost. Furthermore, data of the telemetry are not provided promptly.

SUMMARY OF THE INVENTION

Exemplary embodiments of the invention are directed to a satellite amplifier module, which is easy to maintain.

One aspect of the invention relates to a method for operating an amplifier module of a communication satellite.

The amplifier module can comprise an amplifier unit and a controller for activating the amplifier unit. It is to be understood that the communication satellite can have a plurality of amplifier modules, which can each be assigned to one channel of the satellite.

The amplifier module can be a traveling wave tube module, in which the amplification occurs by way of a traveling wave tube. However, it is also possible that the amplifier module is a semiconductor amplifier module having a semiconductor amplifier.

According to one embodiment of the invention, the method includes the steps of: establishing an undesired state of the amplifier module; storing state data, which indicate the undesired state, in a nonvolatile memory of the amplifier module, after the undesired state has been established; and deactivating the amplifier module after the storage of the state data.

It can be considered to be the core of the invention that (shortly) before the deactivation of the amplifier module as a result of a malfunction, i.e., an undesired state, information about the malfunction, i.e., recent state data, are stored in a nonvolatile memory, so that these data are also still available if the amplifier module was disconnected from the power supply of the satellite for a time as a result of the deactivation.

Accordingly, upon the occurrence of malfunctions the operator of the satellite which fault existed, in particular if the operation of the amplifier module is permanently impaired. In addition, items of information for rapidly occurring procedures (for example, the recognition of a malfunction, an undesired state) are also present in the amplifier module, which are not detected by a slow, regular data query (which can occur every 60 seconds, for example).

An undesired state can be, for example, an existing fault, a malfunction, or a fault which will occur shortly. An undesired state can be that a specific operating parameter or measured value exceeds or falls below a predefined threshold value.

The nonvolatile memory is typically embodied for the purpose of withstanding the environmental conditions in outer space, i.e., the nonvolatile memory can be resistant to temperature variations in a large range and/or resistant in relation to radiation. The environmental conditions to which a satellite is subjected in operation normally stop a person skilled in the art from installing a variety of electronic components, which cannot be replaced or can only be replaced with difficulty if the satellite is located in orbit.

The deactivation of the amplifier module should be understood as a shutdown of the amplifier module in this case, during which the amplifier module is disconnected from a power supply of the satellite, for example. Similarly, the activation of the amplifier module should be understood as turning on or connecting the amplifier module to the power supply of the satellite.

According to one embodiment of the invention, the undesired state is established by executing a protective function, which is applied to detected parameters of the amplifier module, and which ascertains the undesired state from the detected parameters. The detected parameters can comprise, for example, measured values and/or operating parameters, for example, an input current or an input power of the amplifier module or a regulator voltage, a supply voltage, or a current of a traveling wave tube. The detected parameters can also be settable parameters, for example, configuration parameters, however.

The protective function can compare, for example, whether the parameter is located above or below a threshold value or is located inside or outside a predefined interval. For example, the protective function can establish that the input power of the amplifier module has sunk below a specific value, which is then recognized as an undesired state.

According to one embodiment of the invention, the stored state data comprise the type of the protective function. For example, which protective function has responded can be stored in coded form in a digital word.

According to one embodiment of the invention, the stored state data comprise values of parameters processed by the protective function. These values can be, for example, an operating parameter (for example, the input power) and optionally the associated threshold value.

According to one embodiment of the invention, the stored state data comprise values of parameters of the amplifier module, which were detected (for example, measured and/or calculated from measured values) (shortly) before the establishment of the undesired state, and/or which were detected (shortly) before the deactivation of the amplifier module. For example, a predefined set of operating parameters and/or settable parameters can be stored as state data. In this context, "short" can mean less than 10 ms or less than 1 ms, for example.

According to one embodiment of the invention, the method further comprises the steps of: establishing a further undesired state and storing further state data, which relate to the further undesired state, so that the state data and the further state data are stored together in the nonvolatile memory. It is not only possible that the state data for only one (i.e., the most recent) undesired state are stored in the nonvolatile memory, but rather for a plurality of undesired states, for example, a fixed number of previously occurring undesired states.

If, for example, for operation-technology reasons, the data on an undesired state could not be read out by the ground station, the information is still available, even if further undesired states have occurred in the meantime.

It is also possible that the stored state data comprise a time value, which indicates a point in time at which the undesired state was established. If multiple sets of state data are stored, the time between two undesired states can also be stored, to be able to assign them chronologically.

To keep the interruption of the amplifier function of the amplifier module as short as possible, some amplifier modules have an automatic mechanism, which attempts to restart the amplifier module after a short waiting time (for example, a few milliseconds). If the malfunction has then been remedied, the amplifier remains turned on, if the malfunction is still present, the amplifier module turns off permanently. This can also apply if a malfunction occurs again within a short time. Multiple sets of state data can also be stored in the nonvolatile memory in these cases.

According to one embodiment of the invention, the method further comprises the step of: transmitting the stored state data to a ground station. For example, after the amplifier module has been reactivated or restarted, the information about the undesired state can be read out via a telemetry channel. If the amplifier module was automatically reactivated, the information can also be ready for readout.

In addition, it is possible that the operating parameters and/or instantaneously set parameters of the amplifier module are read out at intervals of several seconds (for example, every 30 seconds or every 60 seconds) and transmitted to the ground station, even if no undesired state or no malfunction has occurred.

According to one embodiment of the invention, the stored state data are transmitted when the amplifier module receives a corresponding telecommand from the ground station. For example, the ground station can send a corresponding request (telecommand) to the amplifier module and this then provides the corresponding state data for readout or transmits them via one or more telemetry channels to the ground station.

According to one embodiment of the invention, the stored state data are automatically transmitted after the amplifier module has been reactivated. For example, after the amplifier module has been restarted via a telecommand or automatically, the state data can be transmitted automatically to the ground station in a reaction to the reactivation.

According to one embodiment of the invention, the stored state data remain stored in the nonvolatile memory after the transmission to the ground station. The state data can be available automatically for readout over a certain period of time, before they are erased or overwritten with new state data.

A further aspect of the invention relates to an amplifier module for a communications satellite. A module can be, for example, an assembly having a shared housing or a shared carrier element, on which the components of the amplifier module are fastened and/or using which the components of the amplifier module, for example, a controller, a protective function component, a telemetry component, the amplifier unit, for example, a traveling wave tube or a semiconductor amplifier, etc., can be installed jointly in the satellite.

According to one embodiment of the invention, the amplifier module comprises an amplifier unit and a controller for activating the amplifier unit. The amplifier unit can be a traveling wave tube. The traveling wave tube can comprise, for example, an emitter, which is designed for generating an electron beam upon application of a voltage; an amplifier section, through which the electron beam runs, and in which a conductor is arranged, and in which a high-frequency signal, which runs through the conductor, can be amplified by the electron beam; and a collector, which is designed to absorb the electron beam and returning it to the emitter.

The amplifier module can additionally comprise a preamplifier and/or a linearizer, which is installed in a joint assembly with the other components of the amplifier module, for example.

It is possible that in the case of a traveling wave tube module, two traveling wave tubes are supplied by one power supply and possibly have a shared preamplifier or each traveling wave tube individually has a preamplifier.

Furthermore, the controller comprises a nonvolatile, writable memory, which is designed for storing state data of the amplifier module when the amplifier module is not energized by an external power supply of the satellite. The nonvolatile memory can be provided in a special chip, for example, which can be installed separately from the electronics of the controller in the amplifier module.

The nonvolatile memory and/or the controller can be housed in the power supply (or in the housing of the power supply) of the amplifier module. The nonvolatile memory and/or the controller can also be housed in a preamplifier and/or linearizer, or also partially in the power supply and partially in the preamplifier and/or linearizer, however.

To be able to provide items of information about an undesired state of the amplifier module even when it has been turned off or deactivated, the controller is designed for executing the operating method as described above and hereafter. It is to be understood that features of the amplifier module can also be features of the method and vice versa.

According to one embodiment of the invention, the controller comprises a telemetry component, which is designed for detecting operating parameters and/or settable parameters of the amplifier module as state data. The telemetry component can activate measuring sensors and provide the obtained measured values in digital form, for example.

According to one embodiment of the invention, the controller comprises a protective function component, which is designed for analyzing operating parameters and/or settable parameters of the amplifier module as state data, to determine an undesired state of the amplifier module. For example, the telemetry component may provide these parameters to the protective function component.

According to one embodiment of the invention, the amplifier module further comprises a telecommand interface, which is designed for receiving a telecommand from a ground station, which triggers a transmission of state data stored in the nonvolatile memory. For example, this telecommand interface can be an external interface of the amplifier module, which the amplifier module can use to communicate with a further controller of the satellite.

In summary, such an operating method and such an amplifier module can have the following advantages: In the event of a malfunction of the amplifier module, an item of information is available as to which protective circuit or protective function has responded. In the event of repeated malfunctions, it can be established whether the same cause always existed. Telemetry data detected promptly from the occurrence of the malfunction can provide information about the operating state of the amplifier module at the point in time of the fault. This information can be used for the fault search, to localize the cause of the fault.

Exemplary embodiments of the invention will be described in greater detail hereafter with reference to the appended figures.

BRIEF DESCRIPTION OF THE FIGURES

Fundamentally, identical or similar parts are provided with identical reference signs.

DETAILED DESCRIPTION OF EXEMPLARY EMBODIMENTS

Figure 1:
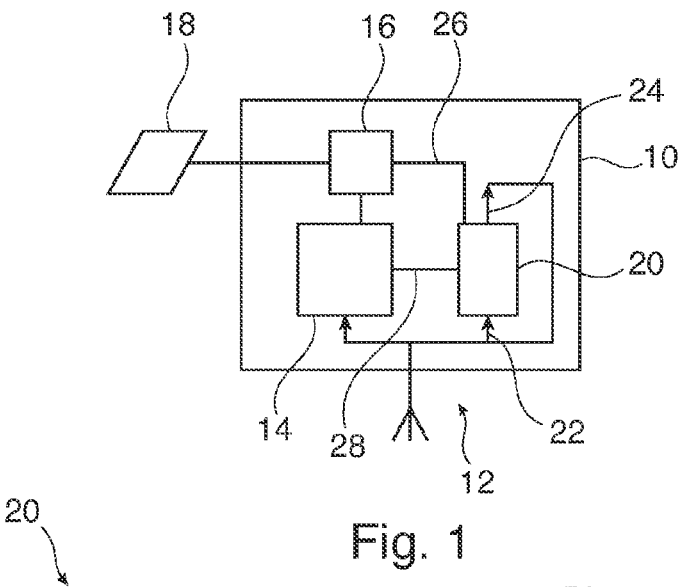
FIG. 1 shows a schematic view of a communications satellite according to one embodiment of the invention.

FIG. 1 shows a communications satellite 10 having an antenna 12, a main control unit or main controller 14, and a power supply 16, which is supplied with energy by a solar panel 18, for example.

Furthermore, the communication satellite 10 has an amplifier module 20 in the form of a traveling wave tube module 20. Only one channel of the communication satellite 10 is shown in FIG. 1, typically a communication satellite 10 can have multiple channels, which can each comprise a traveling wave tube module 20.

The communication satellite 10 can receive a high-frequency signal 22 via the antenna 12 and relay it to the traveling wave tube module 20. The high-frequency signal 22 is amplified therein to form an amplified high-frequency signal 24 and can be emitted again via the antenna 12 (or a further antenna). The traveling wave tube module 20 is supplied with voltage 26 via the power supply 16 in this case. Furthermore, the traveling wave tube module 20 can be activated by the control unit 14 and can receive telecommands 28, for example, which have been received via the antenna 12 and analyzed by the control unit 14, for example.

Figure 2:
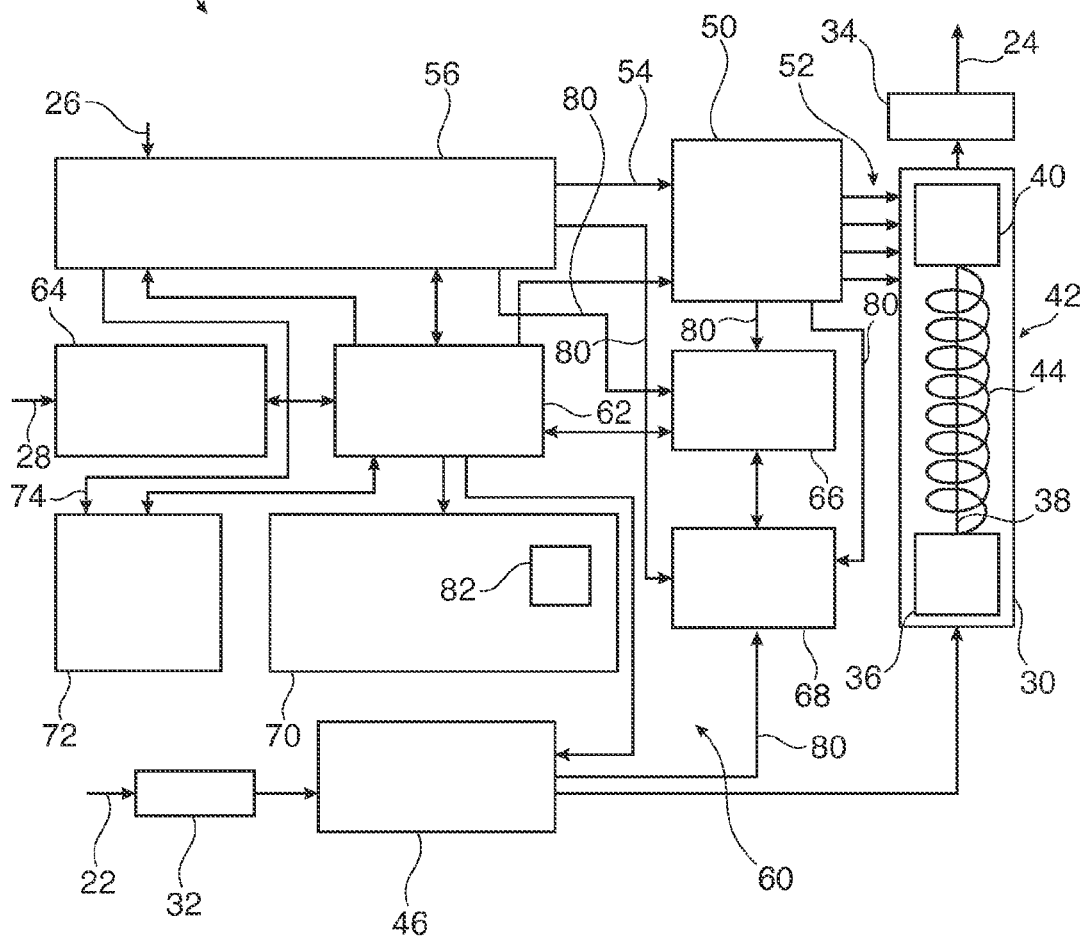
FIG. 2 shows a schematic view of an amplifier module according to one embodiment of the invention.

FIG. 2 shows a traveling wave tube module 20 in greater detail as a block diagram. The traveling wave tube module 20 comprises a traveling wave tube 30, which receives the high-frequency signal 22 via a high-frequency input 32 and outputs the amplified high-frequency signal 24 via a high-frequency output 34.

The traveling wave tube 30 comprises an emitter 36, using which an electron beam 38 can be generated, and a collector 40, which absorbs the electron beam 38 again. In this manner, the electric current from the electron beam 38 can be returned back to the emitter 36. An amplifier region 42, in which the high-frequency signal 22 is amplified by the electron beam 38, lies between the emitter and the collector 38. The high-frequency signal 22 is sent by way of a coiled conductor 44 through the traveling wave tube 30 in this case.

Between the high-frequency input 32 and the traveling wave tube 30, the traveling wave tube module 20 can have a channel amplifier and/or linearizer 46, using which the unamplified high-frequency signal 22 can be pre-amplified and/or linearized, before it is supplied to the traveling wave tube 30.

The remaining components of the traveling wave tube module 20 represent the power supply for the traveling wave tube 30.

The traveling wave tube 30 is supplied by the high-voltage generator 50 with a plurality of supply voltages 52, for example, an anode voltage, one or more collector voltages, a cathode voltage of the emitter, etc.

A supply voltage 54 for the high-voltage generator 50 is provided by a pre-regulator and filter 56, which converts the voltage 26 from the power supply 16 of the satellite 10 to a constant and uniform DC voltage.

The traveling wave tube module 20 furthermore comprises a controller 60, which comprises a central component 62, a telemetry and telecommand interface 64, a protective function component 66, a telemetry component 68, and a nonvolatile data memory 70. The controller 60 or its components 62, 64, 66, 68, 70 are supplied with voltage by an auxiliary voltage supply 72, which is supplied with a voltage 74 by the pre-regulator and filter 56.

In the telemetry component 68, the telemetry data or operating parameters and settable parameters 80 of the traveling wave tube module 20 are detected and collected. For example, the telemetry component 68 can detect sensor data from the high-voltage generator 50, the pre-regulator and filter 56, and the channel amplifier and/or linearizer 46 and convert them into digital form.

In the protective function component 66, protective functions and/or alarm functions are executed, which check whether detected parameters 80 move in the desired scope. For this purpose, the protective function component 66 can detect these parameters directly and/or can receive them provided by the telemetry component 68. Examples of protective functions are undervoltage protection, overload protection, etc.

Fixedly defined data can be stored or present data, for example, operating parameters and settable parameters 80, can be stored as state data 82 in the nonvolatile data memory 70 or memory component 70. If a protective function is activated, the controller 60 can determine the triggering parameter 70, optionally record all telemetry data and store this information in the data memory 70. Since it is a non-volatile memory 70, the state data 82 are also available after the amplifier module 20 has been restarted or has automatically restarted and was de-energized for some time.

The telemetry and telecommand interface 64 is connected to the other components 14 of the satellite 10 and therefore represents a connection to the control station on the ground. Via the interface, the amplifier module 20 or the controller 60 can receive telecommands, for example, control commands, or the amplifier module 20 or the controller 64 can deliver data about the operating state.

The central component 62 of the controller 64 can regulate and monitor all procedures, for example, the triggering of the protective function, the storage and readout of the state data, etc.

Figure 3:
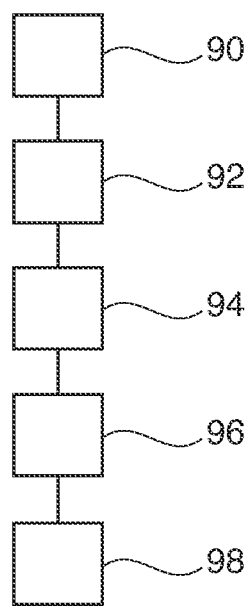
FIG. 3 shows a flow chart for a method for operating an amplifier module according to one embodiment of the invention.

FIG. 3 shows a flow chart for operating the amplifier module 20.

An undesired state of the amplifier module 20 is established in step 90. For this purpose, the protective function module can respectively compare detected parameters 70, which originate from the telemetry component 68, for example, to a threshold value and trigger an alarm if the values exceed or fall below the thresh-old value.

For example, an alarm for a voltage undersupply can be triggered if the input power of the pre-regulator and filter 56 falls below a specific value. An alarm can also be triggered for an overvoltage if, for example, the collector voltage of the traveling wave tube exceeds a specific value.

After the undesired state has been established, in step 92, state data 81 that indicate the undesired state are stored in the nonvolatile memory 70. This can be performed, for example, by the central component 62 of the controller 64, which receives the alarm of the protective function and reads out the state data 82 to be stored or the associated parameters.

The stored state data 82 can comprise the type of the protective function and/or the point in time at which the protective function was triggered. For example, the protective functions can be numbered and the corresponding number can be stored in the state data 82.

The stored state data 82 can comprise values of parameters 70 of the amplifier module 20, which were processed by the protective function, for example, the in-put power or the cathode voltage.

Furthermore, the stored state data 82 can comprise values of further, other parameters 70 of the amplifier module 20, which were detected before the establishment of the undesired state and/or which were detected before the deactivation of the amplifier module 20. For example, every time when state data 82 are stored, all voltage and current values, which were detected for the traveling wave tube 30, can also be stored.

After the storage of the state data 82, in step 94, the amplifier module 20 is deactivated. For example, the central component 62 of the controller 60 can instruct the pre-regulator and filter 56 to disconnect the amplifier module 20 from its supply voltage.

In step 96, the amplifier module 20 is reactivated, for example, via an external controller 14 of the satellite 10, which executes the starting procedure automatically after a certain time, for example, or is prompted thereto by a corresponding telecommand of the ground station.

In step 98, the stored state data 82 are transmitted to the ground station. This can be prompted, for example, in that the controller 64 receives a corresponding telecommand 28 from the ground station and/or the controller 64 automatically transmits the stored state data 82 after the amplifier module 20 has been reactivated. For this purpose, the controller 64 can check in the nonvolatile memory 70, for example, after the starting of the amplifier module 20, as to whether non-transmitted state data 82 are present, and can subsequently transmit them to the ground station.

In addition, it is to be noted that "comprising" does not exclude other elements or steps and "a" or "an" does not exclude a plurality. Furthermore, it is to be noted that features or steps which have been described with reference to one of the above exemplary embodiments can also be used in combination with other features or steps of other above-described exemplary embodiments. Reference signs in the claims are not to be considered to be a restriction.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for operating an amplifier module of a communication satellite, the method comprising the steps:
   establishing an undesired state of the amplifier module;
   storing state data, which indicate the undesired state, in a nonvolatile memory of the amplifier module, after the undesired state has been established;
   deactivating the amplifier module after the storage of the state data.

2. The method of claim 1, wherein the undesired state is established by executing a protective function, which is applied to detected parameters of the amplifier module and which ascertains the undesired state from the detected parameters.

3. The method of claim 2, wherein the stored state data comprise a type of the protective function.

4. The method of claim 2, wherein the stored state data comprise values of parameters of the amplifier module, which were processed by the protective function.

5. The method of claim 1, wherein the stored state data comprise values of parameters of the amplifier module, which were detected before the establishment of the undesired state or were detected before the deactivation of the amplifier module.

6. The method of claim 1, further comprising the step:
   establishing a further undesired state and storing further state data, which relate to the further undesired state, wherein the state data and the further state data are stored together in the nonvolatile memory.

7. The method of claim 1, further comprising the step:
   transmitting the stored state data to a ground station.

8. The method of claim 7, wherein the stored state data are transmitted when the amplifier module receives a corresponding telecommand from the ground station.

9. The method of claim 7, wherein the stored state data are automatically transmitted after the amplifier module has been reactivated.

10. The method of claim 7, wherein the stored state data remain stored in the nonvolatile memory after the transmission to the ground station.

11. An amplifier module for a communication satellite, comprising:
    an amplifier unit; and
    a controller configured to activate the amplifier unit, wherein the controller comprises a nonvolatile, writable memory configured to store state data of the amplifier module when the amplifier module is not energized by an external power supply,
    wherein the controller is configured to
       establish an undesired state of the amplifier module;
       store state data, which indicate the undesired state, in a nonvolatile memory of the amplifier module, after the undesired state has been established;
       deactivate the amplifier module after the storage of the state data.

12. The amplifier module of claim 11, wherein the controller comprises a telemetry component configured to detect operating parameters or settable parameters of the amplifier module as state data.

13. The amplifier module of claim 11, wherein the controller comprises a protective function component configured to analyze operating parameters or settable parameters of the amplifier module, to determine an undesired state of the amplifier module.

14. The amplifier module of claim 11, further comprising:
   a telecommand interface configured to receive a telecommand, which triggers a transmission of state data stored in the nonvolatile memory.

15. The amplifier module of claim 11, wherein the amplifier unit is a traveling wave tube as an amplifier unit.

* * * * *